United States Patent
Bernacchia et al.

(10) Patent No.: US 9,791,881 B2
(45) Date of Patent: Oct. 17, 2017

(54) SELF-DRIVEN SYNCHRONOUS RECTIFICATION FOR A POWER CONVERTER

(71) Applicant: Infineon Technologies Austria AG, Villach (AT)

(72) Inventors: Giuseppe Bernacchia, Villach (AT); Olivier Guillemant, Villach (AT)

(73) Assignee: Infineon Technologies Austria AG, Villach (AT)

( * ) Notice: Subject to any disclaimer, the term of this patent is extended or adjusted under 35 U.S.C. 154(b) by 134 days.

(21) Appl. No.: 14/338,191

(22) Filed: Jul. 22, 2014

(65) Prior Publication Data
US 2016/0028319 A1    Jan. 28, 2016

(51) Int. Cl.
*G05F 3/02* (2006.01)
*G05F 3/24* (2006.01)
(Continued)

(52) U.S. Cl.
CPC .............. *G05F 3/24* (2013.01); *G05F 3/10* (2013.01); *H02M 3/33576* (2013.01);
(Continued)

(58) Field of Classification Search
CPC ........ H02M 3/33592; G05F 3/18; G05F 3/30; G05F 3/262; H03K 5/24; G11C 7/067; G11C 7/062
(Continued)

(56) References Cited

U.S. PATENT DOCUMENTS 5,097,403 A    3/1992  Smith
5,272,392 A *  12/1993 Wong .................. H03K 17/063
                                                    327/109
(Continued)

FOREIGN PATENT DOCUMENTS

CN    101198877 A    6/2008
CN    101355306 A    1/2009
(Continued)

OTHER PUBLICATIONS

"SM74611 Smart Bypass Diode" Datasheet from Texas Instruments, SNVS903—Dec. 2012; retrieved from http://www.ti.com/lit/ds/symlink/sm74611.pdf on Jul. 21, 2014, 11 pp.
(Continued)

*Primary Examiner* — Nguyen Tran
(74) *Attorney, Agent, or Firm* — Shumaker & Sieffert, P.A.

(57) ABSTRACT

A power converter with an isolated topology may include a power transistor, a sense transistor, and a read-out circuit. The sense transistor may be arranged in a current mirror configuration with the power transistor such that the gate terminal of the sense transistor is coupled to the gate terminal of the power transistor and the first drain/source terminal of the sense transistor is coupled to the first drain/source terminal of the power transistor. The read-out circuit may be coupled to the second drain/source terminal of the power transistor and the second drain source/terminal of the sense transistor. The read-out circuit may be arranged to cause a voltage at the second drain/source terminal of the sense transistor to be substantially the same as a voltage at the second drain/source terminal of the power transistor.

20 Claims, 9 Drawing Sheets

(51) Int. Cl.
*G05F 3/10* (2006.01)
*H02M 3/335* (2006.01)
*H03K 17/082* (2006.01)

(52) U.S. Cl.
CPC .... *H02M 3/33592* (2013.01); *H03K 17/0822* (2013.01); *H02M 3/33546* (2013.01); *H03K 2217/0027* (2013.01); *Y02B 70/1475* (2013.01)

(58) Field of Classification Search
USPC .................. 363/21.06, 21.14; 323/311–317; 327/50–52
See application file for complete search history.

(56) References Cited

U.S. PATENT DOCUMENTS

| | | | |
|---|---|---|---|
| 5,903,452 | A | 5/1999 | Yang |
| 6,437,994 | B1 | 8/2002 | Blom et al. |
| 7,015,745 | B1* | 3/2006 | Burinskiy ............... G05F 3/262 327/543 |
| 7,327,149 | B2 | 2/2008 | Chapuis |
| 7,911,813 | B2 | 3/2011 | Yang et al. |
| 7,956,651 | B2 | 6/2011 | Ptacek et al. |
| 8,149,601 | B2 | 4/2012 | Xiaowu et al. |
| 8,482,266 | B2 | 7/2013 | Yu et al. |
| 2010/0014324 | A1* | 1/2010 | Yang ................ H02M 3/33592 363/21.06 |
| 2011/0068762 | A1 | 3/2011 | Nishida |
| 2012/0319736 | A1* | 12/2012 | Ivanov ................ H03K 5/2481 327/76 |
| 2013/0001792 | A1 | 1/2013 | Uno et al. |
| 2015/0145588 | A1* | 5/2015 | Chao ....................... G05F 3/262 327/513 |

FOREIGN PATENT DOCUMENTS

| | | |
|---|---|---|
| CN | 102023664 A | 4/2011 |
| CN | 102622026 A | 8/2012 |

OTHER PUBLICATIONS

Orietti, E. et al., "Analysis of multi-phase LLC resonant converters," Power Electronics Conference (COBEP) 2009, Brazillian, Sep. 27, 2009-Oct. 1, 2009, pp. 464-471; retrieved from http://www.faroudja.com/st-web-ui/static/active/en/resource/technical/document/conference_paper/ANALYSIS%20OF%20MULTI-PHASE %20LLC%20RESONANT%20CONVERTERS.pdf on Jul. 21, 2014, 8 pp.
"An introduction to LLC resonant half-bridge converter," AN2644 Application Note, STMicroelectronics, Sep. 2008, 64 pp.
Abdel-Rahman, "Resonant LLC Converter: Operation and Design," Application Note AN 2012-09, Infineon Technologies, V1.0, Sep. 2012, 19 pp.
Baba et al., "Isolated Supply Overview and Design Trade-Offs," Texas Instruments, SNVA603, 2009, 12 pp. (Applicant points out, in accordance with MPEP 609.04(a), that the year of publication, 2009, is sufficiently earlier than the effective U.S. filing date, Jul. 22, 2014, so that the particular month of publication is not in issue.).
Bell et al., "Topology Key to Power Density in Isolated DC-DC Converters," Power Electronics Technology, Feb. 2011, pp. 16-20.
Wuidart, "Topologies for Switched Mode Power Supplies," STMicroelectronics, Application Note, 1999, 18 pp. (Applicant points out, in accordance with MPEP 609.04(a), that the year of publication, 1999, is sufficiently earlier than the effective U.S. filing date, Jul. 22, 2014, so that the particular month of publication is not in issue.).
Office Action, in the German language, from counterpart German Application No. 102015111654.5, dated May 13, 2016, 5 pp.
Office Action, in the Chinese language, from counterpart Chinese Application No. 201510251422.0, dated Jul. 4, 2017, 7 pp.

* cited by examiner

US 9,791,881 B2

SELF-DRIVEN SYNCHRONOUS RECTIFICATION FOR A POWER CONVERTER

TECHNICAL FIELD

This disclosure relates to power converters, and more specifically to power converters having isolated topologies.

BACKGROUND

Rectification on the secondary side of a power converter with an isolated topology is typically accomplished with one (or more) diodes. However, a diode rectifier on the secondary side of a power converter having an isolated topology may be replaced with a synchronous rectifier, which may be any suitable type of power transistor used in place of a standard diode. A synchronous rectifier is typically a Si power MOSFET. Due to the nature of the switching in the power converter, control of the synchronous rectifiers can be quite difficult and may require extra hardware.

SUMMARY

In general, the disclosure is directed to a method and device in which a power converter having an isolated topology includes a power transistor, a sense transistor, and a read-out circuit. The sense transistor may be arranged in a current mirror configuration with the power transistor such that the gate terminal of the sense transistor is coupled to the gate terminal of the power transistor and the first drain/source terminal of the sense transistor is coupled to the first drain/source terminal of the power transistor. The read-out circuit may be coupled to the second drain/source terminal of the power transistor and the second drain/source terminal of the sense transistor. The read-out circuit may be arranged to cause a voltage at the second drain/source terminal of the sense transistor to be substantially the same as a voltage at the second drain/source terminal of the power transistor.

The details of one or more examples of the disclosure are set forth in the accompanying drawings and the description below. Other features, objects, and advantages of the disclosure will be apparent from the description and drawings, and from the claims.

BRIEF DESCRIPTION OF DRAWINGS

Non-limiting and non-exhaustive examples of the present disclosure are described with reference to the following drawings.

DETAILED DESCRIPTION

Figure 1A:
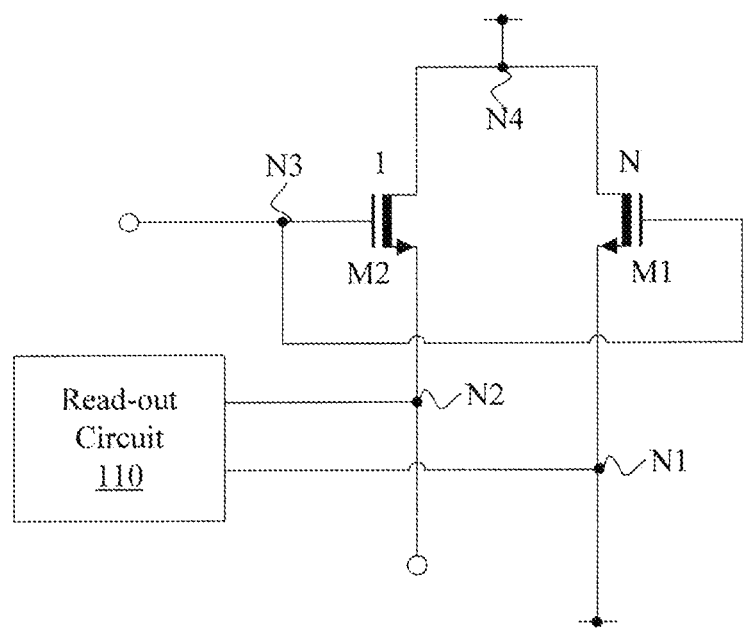
FIG. 1A is a block diagram illustrating an example of a portion of a power converter having an isolated topology.

Various examples of this disclosure will be described in detail with reference to the drawings, where like reference numerals represent like parts and assemblies throughout the several views. Reference to various examples does not limit the scope of this disclosure which is limited only by the scope of the claims attached hereto. Additionally, any examples set forth in this specification are not intended to be limiting and merely set forth some of the many possible examples of this disclosure.

Throughout the specification and claims, the following terms take at least the meanings explicitly associated herein, unless the context dictates otherwise. The meanings identified below do not necessarily limit the terms, but merely provide illustrative examples for the terms. The meaning of "a," "an," and "the" includes plural reference, and the meaning of "in" includes "in" and "on." The phrase "in one embodiment," or "in one example," as used herein does not necessarily refer to the same embodiment or example, although it may. Similarly, the phrase "in some embodiments," or "in some examples," as used herein, when used multiple times, does not necessarily refer to the same embodiments or examples, although it may. As used herein, the term "or" is an inclusive "or" operator, and is equivalent to the term "and/or," unless the context clearly dictates otherwise. The term "based, in part, on", "based, at least in part, on", or "based on" is not exclusive and allows for being based on additional factors not described, unless the context clearly dictates otherwise. Where suitable, the term "gate" is intended to be a generic term covering both "gate" and "base"; the term "source" is intended to be a generic term covering both "source" and "emitter"; and the term "drain" is intended to be a generic term covering both "drain" and "collector." The term "coupled" means at least either a direct electrical connection between the items connected, or an indirect connection through one or more passive or active intermediary devices. The term "signal" means at least one current, voltage, charge, temperature, data, or other signal.

FIG. 1A is a block diagram illustrating an example of a portion 100 of a power converter having an isolated topology. Portion 100 includes power transistor M1, sense transistor M2, and read-out circuit 110. Power transistor M1 has a gate terminal that is coupled to node N3, a first drain/source terminal that is coupled to node N4, and a second drain/source terminal that is coupled to node N1. Sense transistor M2 has a gate terminal that is coupled to node N3, a first drain/source terminal that is coupled to node N4, and a second drain/source terminal that is coupled to node N2.

Read-out circuit 110 is coupled to node N1 and node N2. Read-out circuit 110 is arranged to cause a voltage at node N2 to be substantially the same as a voltage at node N1. Sense transistor M2 and read-out circuit 110 operate together as a means for generating a true scaled version of current through power transistor M1, due to the current mirror arrangement and configuration.

Nodes shown without a connection are not typically intended to illustrate floating nodes, although in some cases they may, but instead illustrate nodes that may be connected in different arrangements in various examples. For examples, N3 may be actively driven by a driver in some examples, but no driver is shown because FIG. 1A is intended to be a high-level block diagram that may have many different arrangements and is not limited any one particular arrangement.

FIG. 1A illustrates an example in which the first drain/source terminals of transistors M1 and M2 are the sources of transistors M1 and M2 respectively, and the second drain/source terminals of transistors M1 and M2 are the drains of transistors M1 and M2, respectively. However, in other examples, the first drain/source terminals of transistors M1 and M2 are the drains of transistors M1 and M2 respectively, and the second drain/source terminals of transistors M1 and M2 are the sources of transistors M1 and M2, respectively (an example of which is shown in FIG. 1B, as discussed in greater detail below).

FIG. 1A shows examples of transistors M1 and M2 in which transistors M1 and M2 are field effect transistors. In some examples, transistors M1 and M2 are Si based MOSFETs. However, this disclosure is not so limited, and in various examples within the scope and spirit of this disclosure, transistors M1 and M2 may be any suitable type of transistors, including, by way of non-limiting examples, Gallium Nitride (GaN) FETs, Si IGBTs, and/or the like. Also, although FIG. 1A literally shows n-type transistors, the invention is not so limited, and in other examples, p-type transistors may be employed. These examples and others are within the scope and spirit of this disclosure.

Figure 1B:
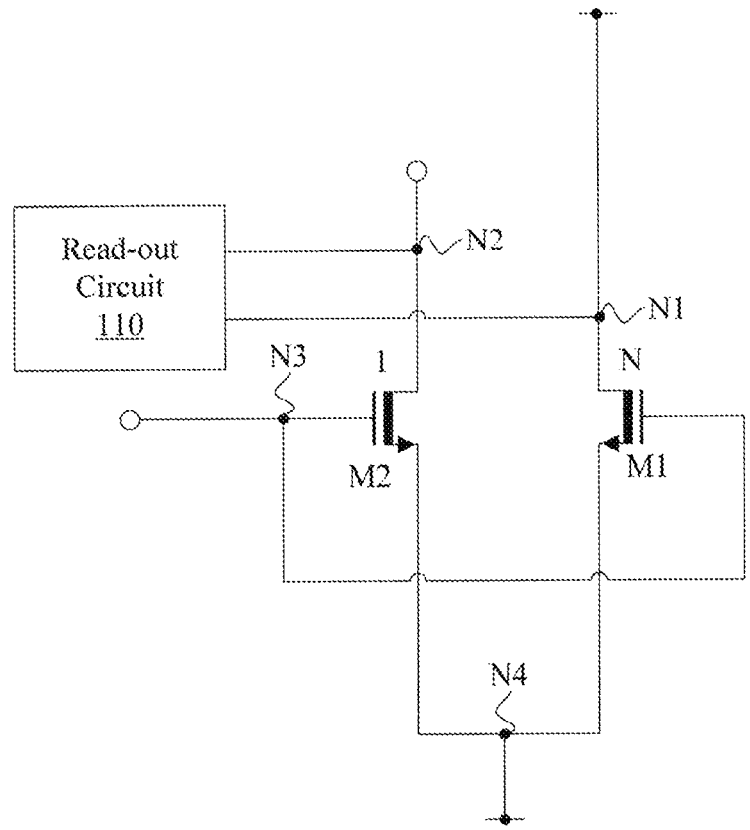
FIG. 1B is a block diagram illustrating another example of the portion of the power converter of FIG. 1A.

FIG. 1B is a block diagram illustrating portion 100B of a power converter that is an example of power converter 100 of FIG. 1A. In FIG. 1B, the first drain/source terminals of transistors M1 and M2 are the drains of transistors M1 and M2 respectively, and the second drain/source terminals of transistors M1 and M2 are the sources of transistors M1 and M2, respectively.

Figure 1C:
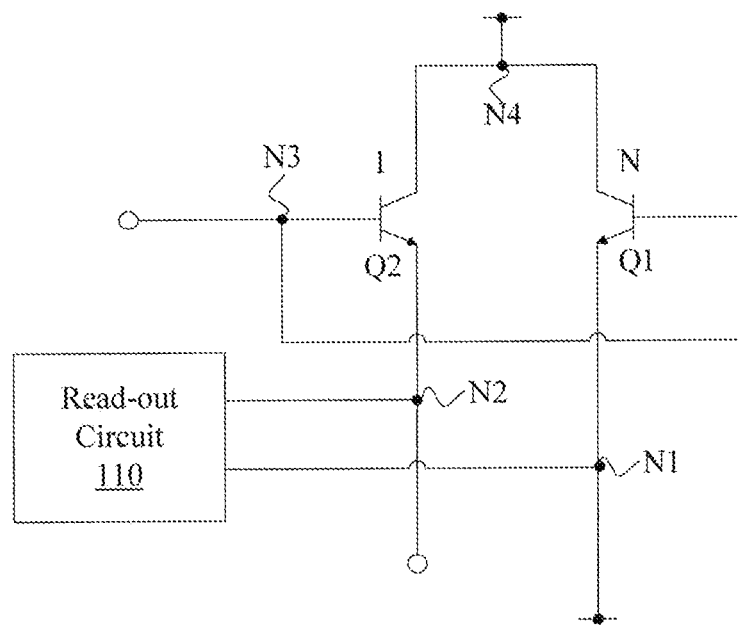
FIG. 1C is a block diagram illustrating another example of the portion of the power converter of FIG. 1A.

FIG. 1C is a block diagram illustrating portion 100C of a power converter that is an example of power converter 100 of FIG. 1A. In FIG. 1C, the power transistor and sense transistor are bipolar transistors Q1 and Q2, respectively.

Figure 2:
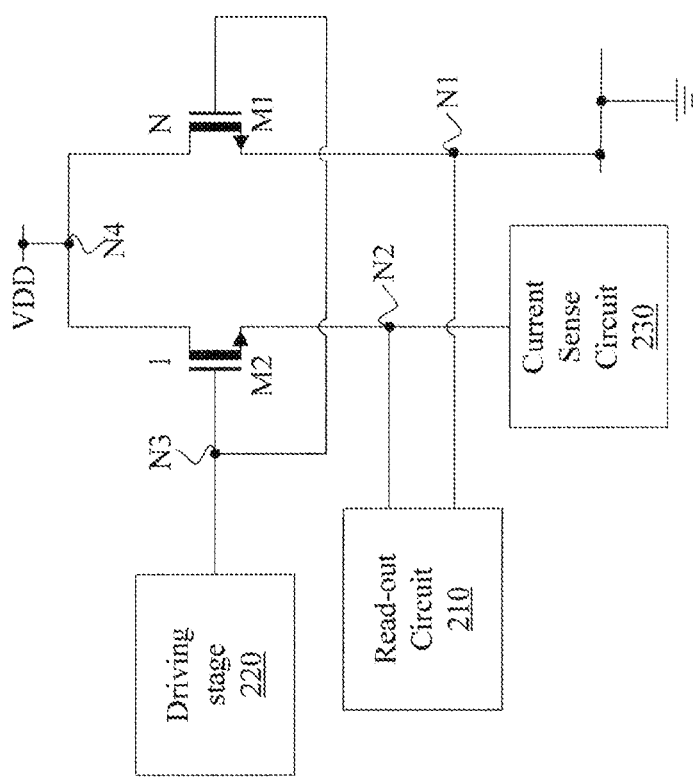
FIG. 2 is a block diagram illustrating an example of the portion of the power converter of FIG. 1A that further includes a driving stage and a current sense circuit.

FIG. 2 is a block diagram illustrating an example of a portion 200 of a power converter, which may be employed as an example of portion 100 of FIG. 1A. Portion 200 further includes driving stage 220 and current sense circuit 230. In some examples, nodes N4 and N1 may be coupled to power supply nodes such as VDD and GND, respectively.

Current sense circuit 230 is arranged to sense current at node N2. Driving stage 220 is arranged to drive node M3 in a manner that is appropriate for synchronous rectification. In some examples, driving stage 220 is configured to control power transistor M1 (and sense transistor M2) to turn on and off with timing that is controlled based on current sensing performed by current sense circuit 230. Sense transistor M2 is embedded on the same die together with power transistor M1, so that transistors M1 and M2 operate together as a current mirror.

In various examples, driving stage 220, power transistor M1, read-out circuit 210, and current sense circuit 230 can be on different dies integrated on the same package, can be fully monolithic, or may each be discrete entities. In some examples, portion 200 may be employed to perform self-driven synchronous rectification.

The areas of transistors M2 and M1 are in a ratio of 1 to N, so that, because the operating conditions are the same, sense transistor M2 carries 1/N the current flowing through power transistor M1. The two devices M1 and M2 have a common gate, and also share the source or the drain (the first drain/source terminal). Read-out circuit 210 equalizes the voltage at node N2 with the voltage at node N1 by injecting current into node N2 so that the current flowing through sense transistor M2 is equal to 1/N of the current flowing through power transistor M1.

Because the current flowing through sense transistor M2 is a true scaled version of the current flowing through power transistor M1, current sense circuit 230 can accurately sense the power transistor current by sensing the sense transistor current.

In some examples, current sense circuit 230 is arranged to sense the zero-crossing of the power transistor current, and the switching of power transistor M1 is controlled so that power transistor M1 is turned off at the zero-crossing of the power transistor current. Read-out circuit 210 equalizes the voltage at node N2 with the voltage at node N1 by injecting current into node N2 so that the current flowing through sense transistor M2 is equal to 1/N of the current flowing through power transistor M1.

As discussed above, in some examples, current sense 230 may be employed to determine when to turn the synchronous rectifier (power transistor M1) on and off. In these examples, by controlling the timing of the turn on and turn off of power transistor M1, current sense circuit 230 controls the synchronous rectification. In other examples, instead of or in addition to sensing the current for the purpose of determining the turn off and/or the turn on timing for power transistor M1 and performing control of the turn on and turn off, the current sense may be employed for other reasons, including detection and/or control of functions such as current control, current-mode control, over-current protection, fault detection, and/or the like.

Figure 3:
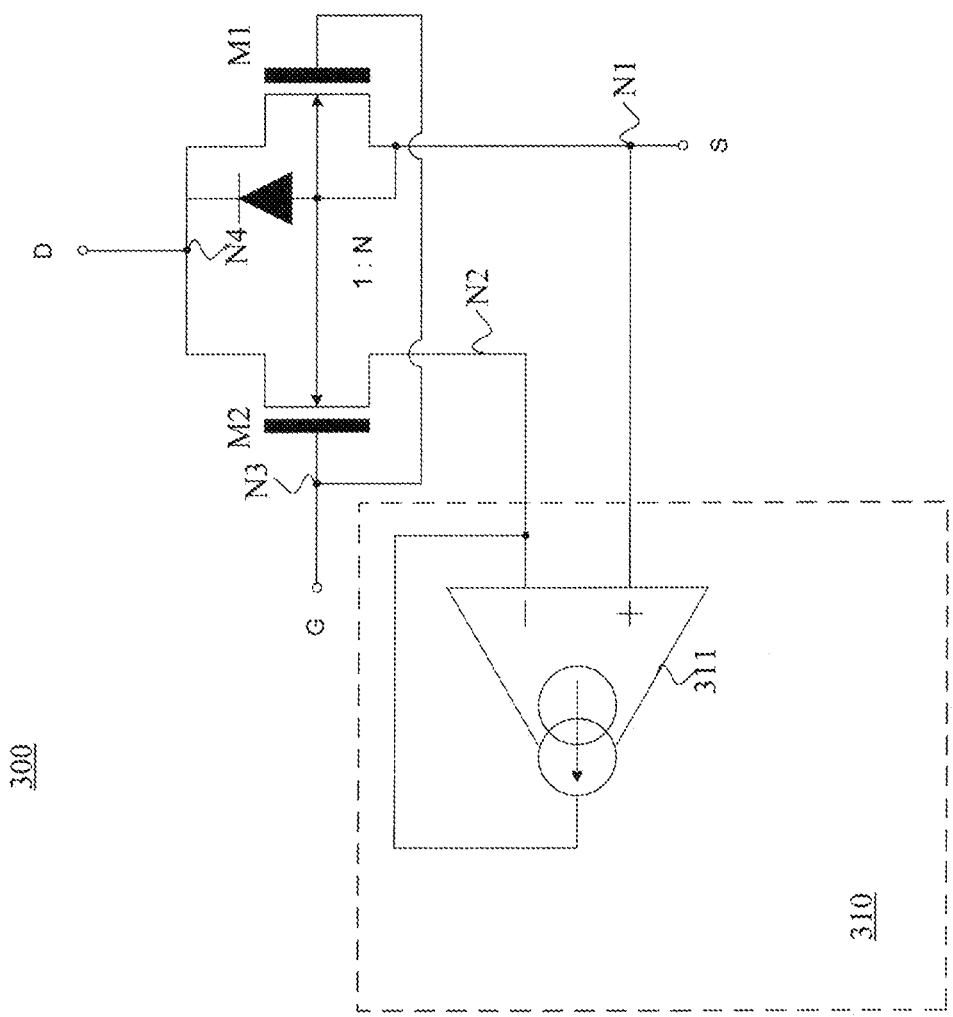
FIG. 3 is a block diagram illustrating an example of the portion of the power converter of FIG. 1A in which the read-out circuit includes a transconductance amplifier.

FIG. 3 is a block diagram illustrating an example of portion 300 of a power converter, which may be employed by an example of portion 100 of FIG. 1A. As shown, read-out circuit 310 includes transconductance amplifier 311. Transconductance amplifier 311 has a non-inverting input that is coupled to node N1, an inverting input that is coupled to node N2, and an output that is coupled to node N2. Transconductance amplifier 311 equalizes the voltage at node N2 with the voltage at node N1 by injecting current into node N2 to force the current flowing through sense transistor M2 to be equal to 1/N of the current flowing through power transistor M1.

Although FIG. 3 shows an example of read-out circuit 310 that consists of a transconductance amplifier, this disclosure is not so limited, and many other variations of read-out circuit 310 may be employed, so long as the read-out circuit causes the voltage at node N2 to be equalized with the voltage at node N1. This may be accomplished, for example, by analog means, digital means, or some combination of analog and digital means.

Figure 4:
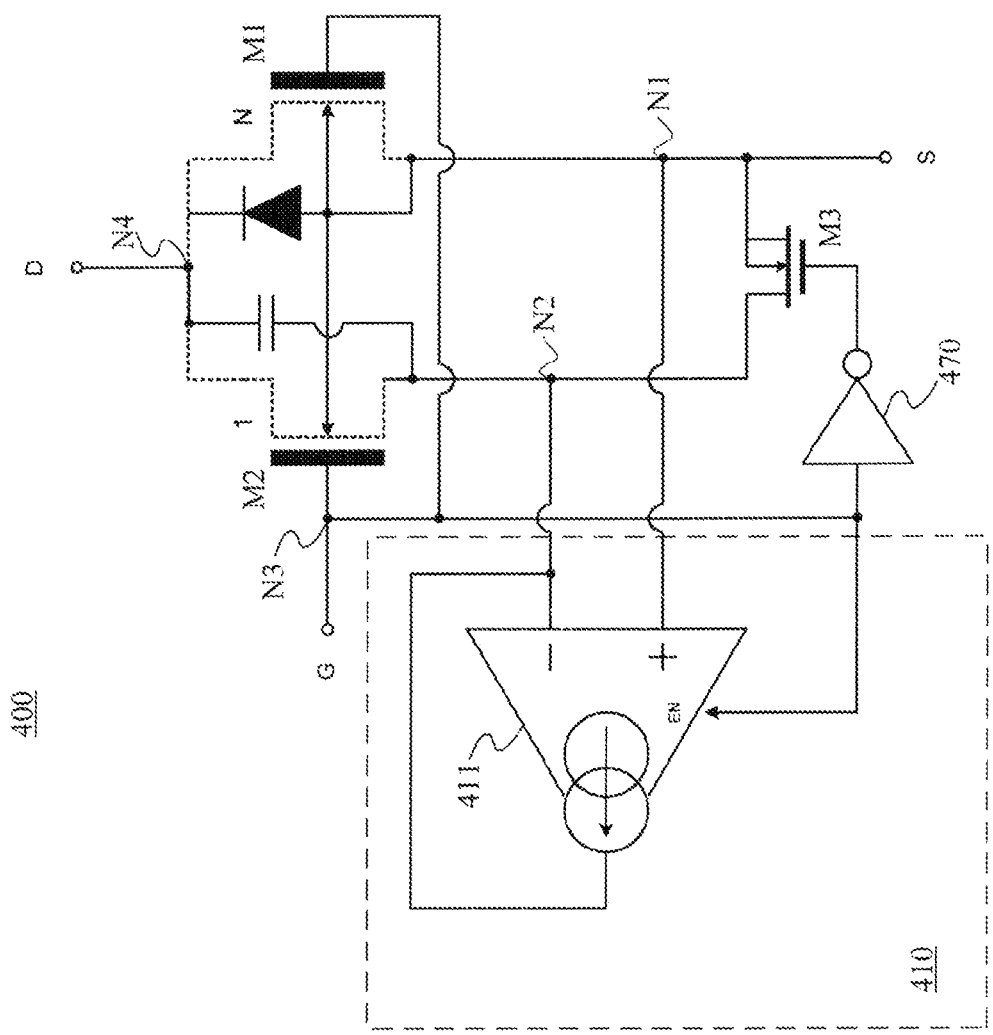
FIG. 4 is a block diagram illustrating an example of the portion of the power converter of FIG. 3 which includes a further switch.

FIG. 4 is a block diagram illustrating an example of portion 400 of a power converter, which may be employed as an example of portion 300 of FIG. 3. Portion 400 further includes pull-down switch M3, which is coupled between nodes N1 and N2. Portion 400 further includes inverter 470, an optional component that is not included in some examples of portion 400.

Pull-down switch M3 need not have a low on-resistance, because during the off time, no current is flowing through pull-down switch M3. In some examples, pull-down switch M3 has a relatively high on-resistance.

Pull-down switch M3 prevents sense node N2 from floating when the synchronous rectifier (power transistor M1) is off. When the drain potential on the synchronous rectifier is brought down by the transformer (not shown in FIG. 4) just before the turn-on, there is a displacement current flowing through the main diode (which can be either the body diode of the power transistor M1 or an external diode) and through the parasitic capacitance between the drain and the sense source. This current also flows through pull-down switch M3, and due to the relatively high on-resistance of switch M3 causes a drop on the sense line compared to the source of power transistor M1. In some examples, the negative voltage drop can be sensed by a source-referred comparator (not shown in FIG. 4) and used to determine the turn-on of the synchronous rectifier.

In some examples, the threshold of the voltage comparator is fixed and equal to a few hundreds mV when the complete product is aimed at server PSUs and telecom SMPS; whereas this threshold could vary with the load for low power applications such as chargers and adapters. In some examples, a proper variation of the threshold can be easily set thanks to the current sensing information at hand.

In various examples, the turn-off of switch M1 can be either immediate upon detection of threshold crossing or delayed according to some other control schemes.

One of these control schemes can be based on the monitoring of the current slope. In applications such as LLC where operation above resonance can occur, slope detection works well in complement to the detection crossing of a fixed or variable current threshold. Indeed, when above resonance, the current flowing through the device will drop down very quickly, making the sole use of a current threshold crossing inefficient, because it gives too little time for the circuitry to react.

In examples that employ slope detection, the circuitry gets warned early enough to turn off the device. But, since the slope gradient is itself limited by the dominant inductor of the topology—the resonant choke in the case of the LLC topology-, the circuitry could turn off the device too early if it acts as soon as the set threshold for the slope gradient is exceeded. For that matter, the periodic monitoring of the slope value by the circuitry provides critical information for an optimal timing of the turn off mechanism.

Figure 5:
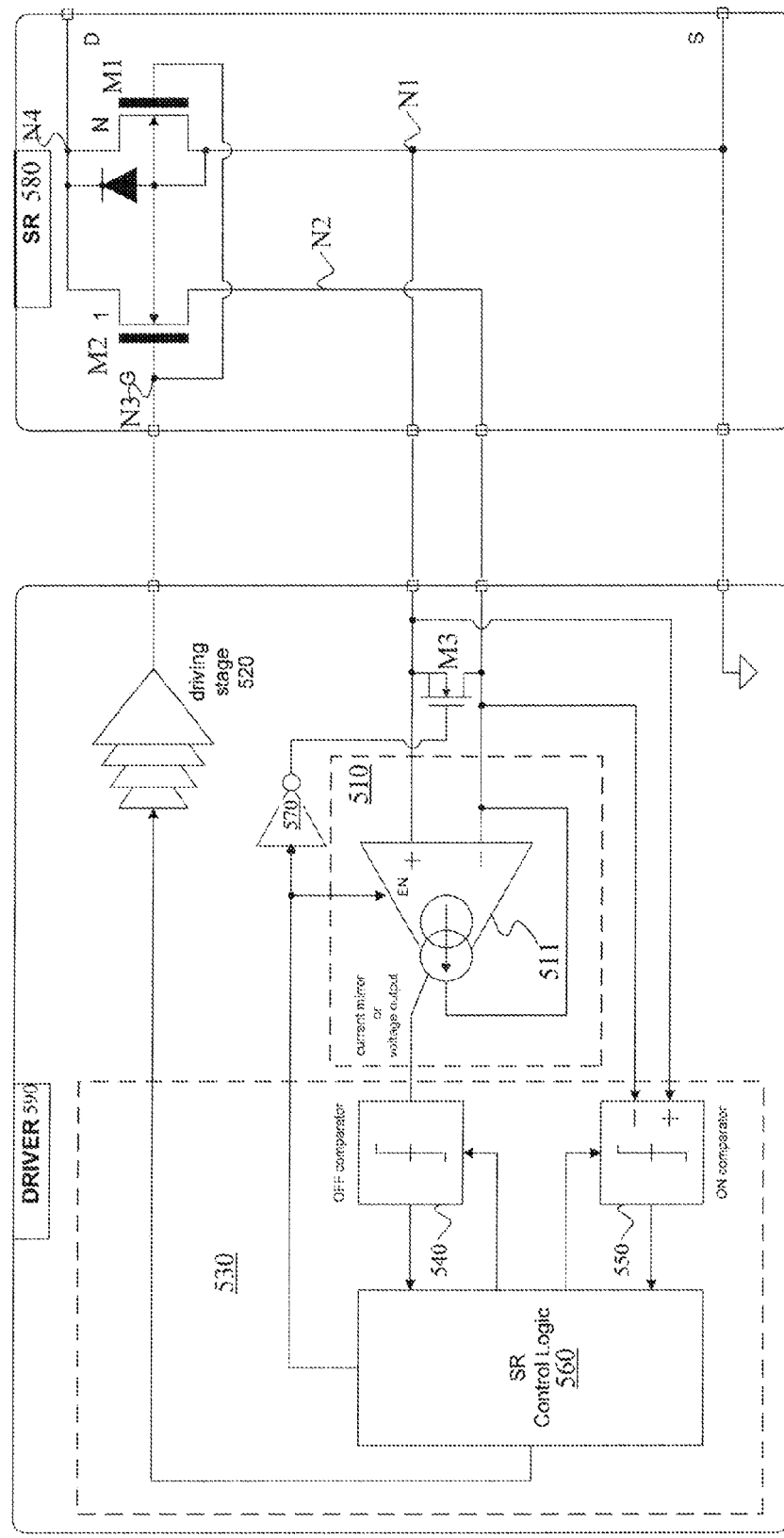
FIG. 5 is a block diagram illustrating an example of the portion of the power converter of FIG. 4 in which the current sense circuit includes an off comparator, an on comparator, and SR control logic.

FIG. 5 is a block diagram illustrating an example of portion 500 of a power converter, which may be employed as an example of portion 400 of FIG. 4. Current sense circuit 530 includes off comparator 540, on comparator 550, and SR control logic 560. Power transistor M1 and sense transistor M2 operate together as synchronous rectifier 580; while driving stage 520, pull-down switch M3, inverter 570, read-out circuit 510, and current sense circuit 530 operate together as driver 590. Although SR control logic 560 is shown, in various examples, SR control logic 560 may be replaced with another device or plurality of devices, analog and/or digital, to provide a control function, and may therefore in some cases be simply referred to as control block 560.

Off comparator 540 is arranged to determine the turn-off time of power transistor M1 and sense transistor M2 based on the zero-crossing transition of the power transistor current. On comparator 550 is arranged to monitor the sense terminal at node N2 to determine the turn-on time of power transistor M1 and sense transistor M2.

Off comparator 540 and on comparator 550 may be configured in different ways and configured to detect on times and off times in various ways in various examples within the scope and spirit of this disclosure. For examples, some examples of on comparator 550 need not employ pull-down switch M3.

In various examples, the current comparison may be performed current-wise, for example by mirroring the sense transistor current and employing a current comparator to compare the mirrored sense current to a reference current; or voltage-wise, for example by converting the sense current to a voltage, such as by mirroring the sense current, applying the mirrored sense current to a resistor, and comparing the resistor current to a reference voltage by employing a voltage comparator. Offsets may be employed in some examples.

In some examples, as previously discussed, off comparator 540 may be employed to detect a zero-crossing of the power transistor current. However, in some applications, the power converter may require a non-zero threshold, which could be variable according to the load in some examples. In these examples, off comparator 540 may be employed to detect the non-zero threshold rather than detecting a zero crossing of the current. In various examples, methods to determine turn off time can be selected according to the operating conditions of the converter. In some examples, for LLC converters, fixed-current threshold detection can be used below resonance while current slope information can be exploited when operating above resonance.

SR control logic 560 is arranged to control the timing of the turn on and turn off of power transistor M1 and sense transistor M2 based on the outputs of off comparator 440 and on comparator 550. In some examples, SR control logic 560 may consist of only a set-reset latch, where the set-reset may consist of, for example, two NAND gates or two NOR gates. The states of the SR latch may be defined by the output of the off comparator and the output of the on comparator. Other examples of SR control logic 560 may include a set-reset latch with other circuitry. In some examples, features such as power saving features and power supply conditioning may be employed as part of SR control logic 560. In some examples, SR control logic 560 may include delay and blanking circuitry for optimal performance. SR control logic 560 may include an analog or digital interface for making current-related information available to the system board.

Figure 6:
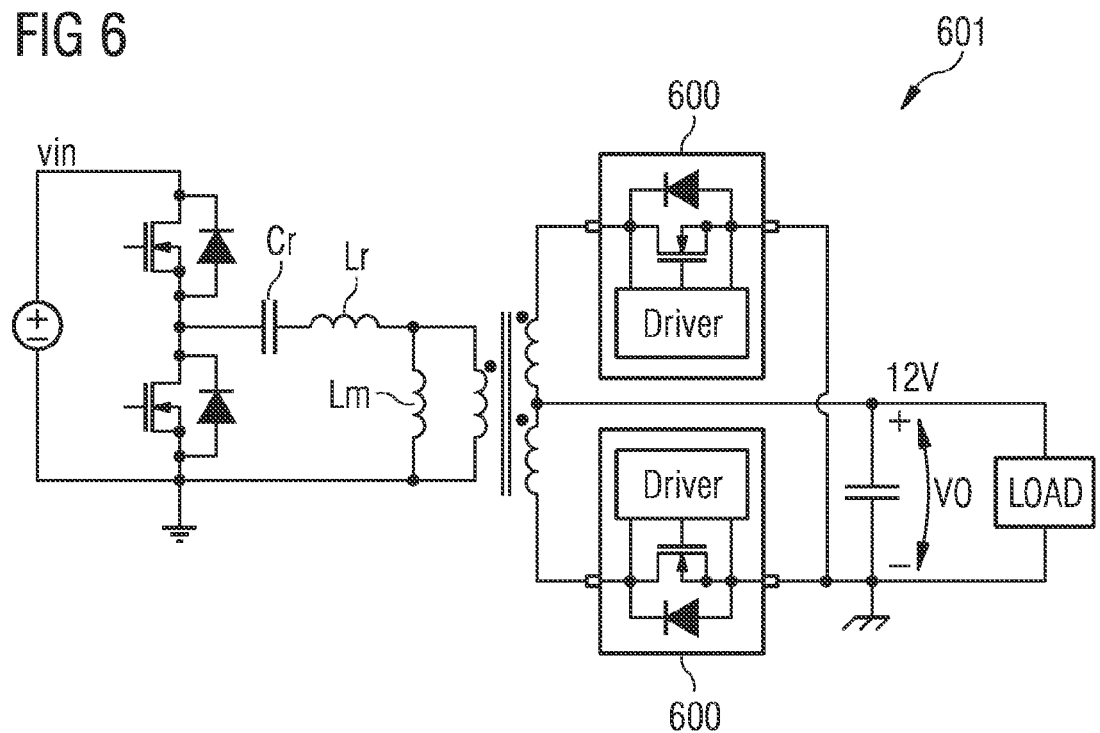
FIG. 6 is a block diagram illustrating an example of a power converter that includes the portion of the power converter illustrated in FIG. 5.

FIG. 6 is a block diagram illustrating an example of power converter 601, which includes the portion of the AC/DC illustrated in any of the portions of the previous figures. In some examples, each portion 600 shown in FIG. 6 may include synchronous rectifier 680, which may be implemented by an example of synchronous rectifier 580 of FIG. 5, and driver 690, which may be implemented by an example of driver 590 of FIG. 5. Various examples of power converter 601 may include flyback and LLC topologies, but this disclosure is not so limited. Further, in various examples, the synchronous rectifiers may be placed on the high-side. FIG. 6 illustrates one example of a power converter having an isolated topology that may be employed in various examples of this disclosure. However, other topologies may be employed in other examples consistent with the scope and spirit of this disclosure.

Figure 7:
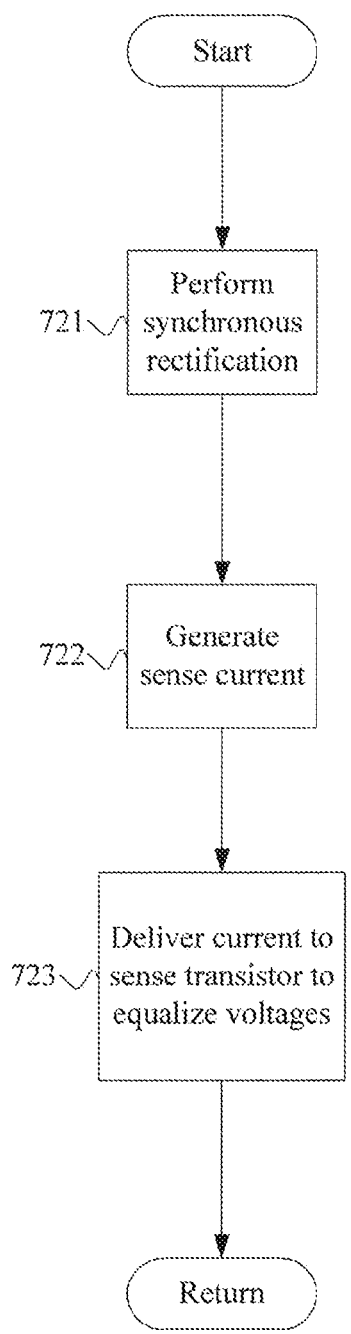
FIG. 7 is a flowchart illustrating an example of a process that may be employed by an example of the portion of FIG. 1A, in accordance with aspects of the present disclosure.

FIG. 7 is a flowchart illustrating an example of process 729, which may be employed, for example, by an example of portion 110 of FIG. 1A.

After a start block, the process proceeds to block 721, where a power transistor (e.g., transistor M1) is used to perform synchronous rectification on a secondary side of a power converter having an isolated topology (e.g., power converter 601). The power transistor includes a gate terminal, a first drain/source terminal, and a second drain/source terminal.

The process then moves to block 722, where a sense transistor (e.g., transistor M2), which is arranged in a current mirror configuration with the power transistor, is used to generate a sense current that is a scaled version of a current through the power transistor, such that the sense transistor includes a gate terminal that is coupled to the gate terminal of the power transistor, a first drain/source terminal that is coupled to the first drain/source terminal of the power transistor, and a second drain/source terminal.

The process then advances to block 723, where current is delivered to the second drain/source terminal of the mirror such that a voltage at the second drain/source terminal of the sense transistor is substantially the same as a voltage at the second drain/source terminal of the power transistor.

The process then proceeds to a return block, where other processing is resumed.

Various examples have been described. These and other examples are within the scope of the following claims.

What is claimed is:

1. A device, comprising a power converter having an isolated topology, including:
   a power transistor including a gate terminal, a first drain/source terminal, and a second drain/source terminal;
   a sense transistor including a gate terminal, a first drain/source terminal, and a second drain/source terminal, wherein:
      the sense transistor is arranged in a current mirror configuration with the power transistor such that the gate terminal of the sense transistor is coupled to the gate terminal of the power transistor and the first drain/source terminal of the sense transistor is coupled to the first drain/source terminal of the power transistor, and
      a current sense circuit is coupled to the second source/drain terminal of the sense transistor, wherein:
         the current sense circuit includes an off comparator and a control block,
         a threshold of the off comparator is a variable threshold, and
         the control block adjusts the variable threshold based on at least one of device operating conditions, a device load, and a "slope gradient of the sense transistor current, wherein a turn-off time of the power transistor depends in part on the slope gradient of the sense transistor current"; and
   a read-out circuit is coupled to the second drain/source terminal of the power transistor and the second drain source/terminal of the sense transistor, wherein the read-out circuit is arranged to cause a voltage at the second drain/source terminal of the sense transistor to be substantially the same as a voltage at the second drain/source terminal of the power transistor.

2. The device of claim 1, wherein the first drain/source terminal of the power transistor is the drain of the power transistor, the second drain/source terminal of the power transistor is the source of the power transistor, the first drain/source terminal of the sense transistor is the drain of the sense transistor, and wherein the second drain/source terminal of the sense transistor is the source of the sense transistor.

3. The device of claim 1, wherein the first drain/source terminal of the power transistor is the source of the power transistor, the second drain/source terminal of the power transistor is the drain of the power transistor, the first drain/source terminal of the sense transistor is the source of the sense transistor, and wherein the second drain/source terminal of the sense transistor is the drain of the sense transistor.

4. The device of claim 1, wherein the gate terminal of the power transistor is the base of the power transistor, first drain/source terminal of the power transistor is the collector of the power transistor, the second drain/source terminal of the power transistor is the emitter of the power transistor, the gate terminal of the sense transistor is the base of the sense transistor, the first drain/source terminal of the sense transistor is the collector of the sense transistor, and wherein the second drain/source terminal of the sense transistor is the emitter of the sense transistor.

5. The device of claim 1, wherein the gate terminal of the power transistor is the base of the power transistor, first drain/source terminal of the power transistor is the emitter of the power transistor, the second drain/source terminal of the power transistor is the collector of the power transistor, the gate terminal of the sense transistor is the base of the sense transistor, the first drain/source terminal of the sense transistor is the emitter of the sense transistor, and wherein the second drain/source terminal of the sense transistor is the collector of the sense transistor.

6. The device of claim 1, wherein the read-out circuit includes a first transconductance amplifier including a first input that is coupled to the second drain/source terminal of the power transistor, a second input that is coupled to the second drain/source terminal of the sense transistor, and an output that is coupled to the second drain-source terminal of the sense transistor.

7. The device of claim 1, wherein the power converter further includes a pull-down switch, wherein the pull-down switch connects the second drain/source terminal of the power transistor to the second drain/source terminal of the sense transistor.

8. The device of claim 1, wherein the current sense circuit is arranged to control timing of synchronous rectification for the power transistor based on current through the sense transistor detected by the current sense circuit.

9. The device of claim 1, wherein the current sense circuit is arranged to control current-mode control of an output DC voltage based on current through the sense transistor detected by the current sense circuit.

10. The device of claim 1, wherein the control block includes a set-reset latch.

11. The device of claim 1, wherein the power converter further includes a driving stage and an on comparator, and wherein a control block and the driving stage are arranged to turn on the power transistor and the sense transistor when an output of the on comparator is asserted.

12. The device of claim 1, wherein the off comparator is arranged to detect a current threshold crossing transition of current associated with the sense transistor.

13. The device of claim 12, wherein the current threshold crossing transition is a zero crossing transition.

14. The device of claim 12, wherein the power converter further includes a driving stage, wherein the control block and the driving stage are arranged to turn off the power transistor and the sense transistor when the off comparator detects the current threshold crossing transition of the current associated with the sense transistor.

15. The device of claim 12, wherein the control block adjusts at least one of the current threshold crossing transition based on at least one parameter.

16. A method, comprising:
using a power transistor to perform synchronous rectification on a secondary side of a power converter having an isolated topology, wherein the power transistor includes a gate terminal, a first drain/source terminal, and a second drain/source terminal;
using a sense transistor that is arranged in a current mirror configuration with the power transistor to generate a sense current that is a scaled version of a current through the power transistor, such that the sense transistor includes a gate terminal that is coupled to the gate terminal of the power transistor, a first drain/source terminal that is coupled to the first drain/source terminal of the power transistor, and a second drain/source terminal; and
delivering current to the second drain/source terminal of the mirror such that a voltage at the second drain/source terminal of the sense transistor is substantially the same as a voltage at the second drain/source terminal of the determining a slope gradient of the scaled version of the current through the power transistor;
adjusting a current threshold crossing transition of the scaled version of the current through the wherein a turn-off time of the power transistor depends in part on the slope gradient of the scaled version of the current through the power transistor.

17. A device, comprising a power converter with an isolated topology, including:
a power transistor and a sense transistor; and
a sense and control unit,
wherein the sense transistor is arranged to generate a true scaled version of a current through the power transistor, such that a voltage at a first drain/source terminal of the sense transistor is substantially the same as a voltage at a first drain/source terminal of the power transistor; and
wherein the sense and control unit is configured to:
compare a sense transistor current to at least one reference current;
determine a slope gradient of the sense transistor current and
in response to comparing the sense transistor current to the at least one reference current, determine a turn-off time of the power transistor, wherein the turn-off time depends in part on the slope gradient of the sense transistor current.

18. The device of claim 17, wherein comparing the sense transistor current to at least one reference current comprises converting the sense transistor current to a voltage and comparing the converted sense transistor current to at least one reference voltage.

19. The device of claim 12, wherein the sense and control unit adjusts a propagation delay of at least one of an on comparator or the off comparator based on at least one parameter.

20. The device of claim 17, wherein the sense and control unit is further configured to determine a turn-on time of the power transistor and the sense transistor.

* * * * *